United States Patent [19]

Voorman

[11] 4,333,158

[45] Jun. 1, 1982

[54] AUTOMATIC GAIN CONTROL CIRCUIT FOR AN ADAPTIVE FILTER

[75] Inventor: Johannes O. Voorman, Eindhoven, Netherlands

[73] Assignee: U.S. Philips Corporation, New York, N.Y.

[21] Appl. No.: 129,050

[22] Filed: Mar. 10, 1980

[30] Foreign Application Priority Data

Mar. 16, 1979 [NL] Netherlands ......................... 7902093

[51] Int. Cl.³ ....................... H03H 21/00; H03G 3/20
[52] U.S. Cl. .................................... 364/825; 307/493; 333/18; 375/14
[58] Field of Search ................ 364/825; 358/167, 905; 375/14; 333/18, 28; 307/493

[56] References Cited

U.S. PATENT DOCUMENTS

| | | | |
|---|---|---|---|
| 3,632,905 | 1/1972 | Thomas et al. | 179/170.2 |
| 3,715,670 | 2/1973 | Hirsch et al. | 375/14 |
| 4,013,980 | 3/1977 | Schollmeier | 333/18 |
| 4,087,654 | 5/1978 | Mueller | 179/170.2 |
| 4,184,129 | 1/1980 | Macchi et al. | 333/18 |

*Primary Examiner*—Felix D. Gruber
*Attorney, Agent, or Firm*—Thomas A. Briody; William J. Streeter; Edward W. Goodman

[57] ABSTRACT

An adaptive filter having a delay circuit, taps of which comprise amplitude control circuits controlled by means of an error signal which indicates the difference between the output signal of the filter and a reference signal, includes a further control circuit which controls the amplitude of the reference signal such that an unwanted stable state for the filter is prevented from occurring.

3 Claims, 5 Drawing Figures

AUTOMATIC GAIN CONTROL CIRCUIT FOR AN ADAPTIVE FILTER

BACKGROUND OF THE INVENTION

The invention relates to an adaptive filter including a delay circuit taps of which comprise amplitude control circuits, also including a difference-determining circuit forming an error signal of a signal corrected by the filter with respect to a reference signal which has a waveform which substantially corresponds to the desired waveform of the signal corrected by the filter, circuits for obtaining control signals for the amplitude control circuits being controlled by means of this error signal and including an automatic gain control circuit having a further control circuit.

Nachrichten Technische Zeitschrift 1971, Vol. 1, pages 18-24, page 20 in particular, discloses an adaptive filter of the above-mentioned kind. The further control circuit there has for its function to keep the amplitude at the center of main tap of the delay circuit of the filter constant and it is arranged outside the filter, that is to say before the input of the filter, as the filter utilizes the error signal. In certain cases it appears that such a control may result in an unwanted stable state wherein the amplitude of the filter output signal becomes zero.

SUMMARY OF THE INVENTION

It is an object of the invention to provide the further control circuit in such a place that the above-mentioned drawback is obviated.

According to the invention an adaptive filter of the type mentioned in the opening paragraph is therefore characterized in that the further control circuit is provided at an input of the difference determining circuit, whereas the control signal for this further control circuit is obtained from an integrator at an output of a multiplying circuit to which the corrected output signal and the error signal are applied.

It appeared that by the action of the further control circuit on the amplitude of the reference signal or on the amplitude of the corrected signal and the error signal, a blocked state, which may particularly occur on actuation, is prevented from occurring. In addition, a stable final state with a zero amplitude of the output signal of the filter does not occur anymore if there is a d.c. voltage component in the signal to be corrected by the filter. Namely, a control before the filter would tend to control this d.c. voltage component to zero if the reference signal does not contain this d.c. voltage component and in general this cannot be the case because it usually has an unknown value which is influenced by, for example, unwanted contributions of circuits.

A further embodiment of an adaptive filter according to the invention is characterized in that the further control circuit is a multiplying circuit. Owing to this measure an influence exercised by unwanted direct currents on the amplitude control systems is substantially eliminated.

An adaptive filter according to the invention is very suitable for suppressing echoes in data signals which are present at a certain level in a video signal, such as teletext signals or digital audio signals. A television receiver having such a filter gives a very good echo suppression which cannot only be effective on the data signal but also on the remaining portion of the signal, so that the quality of a television picture displayed by the receiver can improve.

DESCRIPTION OF THE DRAWINGS

The invention will now be further explained with reference to the drawings.

In the drawings.

DESCRIPTION OF THE PREFERRED EMBODIMENT

Figure 1:
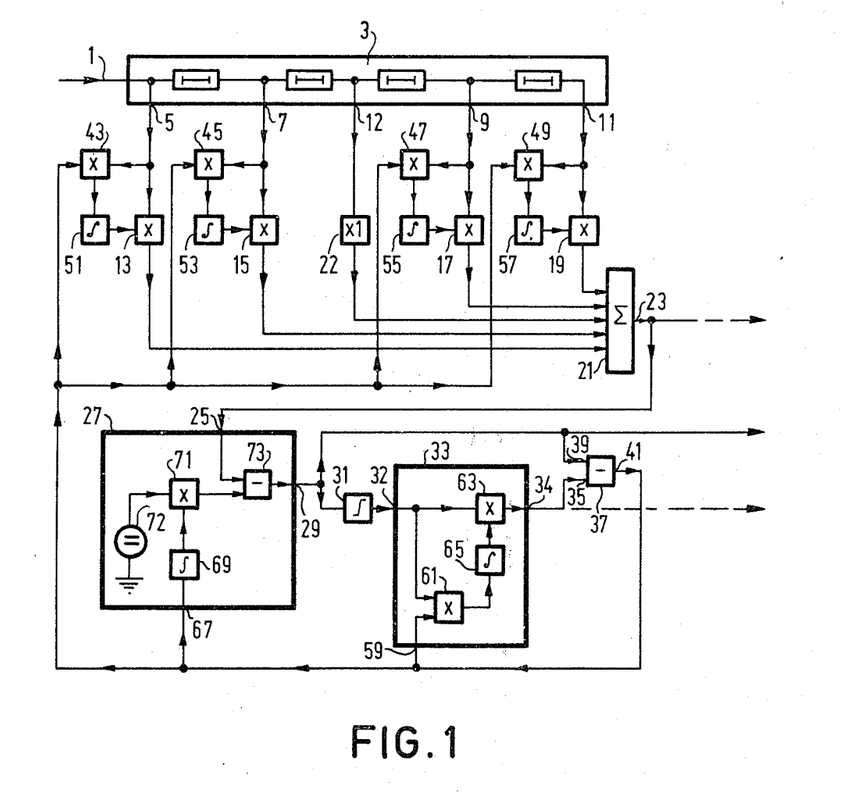
FIG. 1 illustrates an adaptive filter according to the invention by means of a block diagram.

In FIG. 1 a signal which is to be corrected by the filter is applied to an input 1 of an adaptive filter. For the construction of the filter as it will be described hereinafter, this signal is a video signal of a television signal. In certain periods of time this video signal comprises data information such as, for example, teletext information or digital video information. Generally, this information is present in the video signal at a level which deviates from the zero level of that video signal.

In the description of FIG. 1 only the operation of the adaptive filter during the occurrence of the data signal will be described. The subsequent Figures show what gate circuits can be used to make the adaptive action of the filter operable during the occurrence of the data signal and to maintain the corrective action of the filter also for the remaining portion of the video signal.

The input 1 of the filter is at the same time the input of a delay circuit 3 having a number of taps 5, 7, 9, 11 and 12. The taps 5, 7, 9 and 11 are connected to an adding circuit 21 via amplitude control circuits 13, 15, 17 and 19, respectively, and the tap 12 via a circuit 22 having a fixed transfer factor equal to unity.

A signal which is applied to an input 25 of a clamping circuit 27 is obtained from an output 23 of the adding circuit 21. The clamping circuit 27 corrects the d.c. voltage level of the data signal such that a signal obtained from an output 29 thereof is suitable to be processed by a threshold circuit 31 to which it is applied.

An output signal of the threshold circuit 31 is applied to an input 32 of an automatic gain control circuit 33, an output 34 of which is connected to an input 35 of a difference-determining circuit 37, a second input 39 of which receives the signal coming from the output 29 of the clamping circuit 27.

The signal obtained at the input 35 of the difference-determining circuit 37, via the threshold circuit 31 and the automatic gain control circuit 33, is called the reference signal. Because of the action of the threshold circuit 31, the reference signal has a waveform which substantially corresponds to the waveform the corrected signal at the second input 39, which is, at the same time, the output of the filter, should have. A signal, called an error signal and which controls a plurality of automatic settings, is obtained from an output 41 of the difference-determining circuit 37.

The error signal at the output 41 of the difference-determining circuit 37 is applied to four circuits 43, 45, 47, 49, which apply control signals to the amplitude control circuits 13, 15, 17 and 19, respectively, via an integrator 51, 53, 55 and 57, respectively, and which are formed by amplifiers the other inputs of which are connected to the taps 5, 7, 9 and 11, respectively. The amplifiers 43, 45, 47, 49 form, together with the integrators 51, 53, 55, 57, so-called correlation circuits which ensure, via the amplitude control circuits 13, 15, 17, 19, that the corrected signal at the second input 39 of the difference-determining circuit 37 becomes substantially equal to that of the reference signal at the input 35 thereof.

The error signal coming from the output 41 of the difference-determining circuit 37 is also applied to an input 59 of the automatic gain control circuit 33. Connected to this input 59 there is an input of an amplifier 61 another input of which is connected to an input of a further control circuit 63, which is connected to the input 32 of the automatic gain control circuit 33. Via an integrating circuit 65, an output of the multiplier 61 is connected to a further input of the further control circuit 63, an output of which is connected to the output 34 of the automatic gain control circuit 33. The further control circuit 63 is constituted by a multiplier.

The automatic gain control circuit 33 now controls the amplitude of the reference signal to such a value that the error signal at the output 41 of the difference-determining circuit assumes a value which approaches the value of the desired corrected signal as closely as possible. The place where the automatic gain control is now active ensures that no unwanted stable state can occur and any direct current component in the corrected signal cannot provoke the control to zero of the output signal of the filter.

The influence of the direct current component in the corrected signal on the amplitude control circuits 13, 15, 17, 19 is reduced by the clamping circuit 27, to an input 67 of which the error signal is applied, this error signal being applied via an integrating circuit 69 to an input of a multiplier 71, a further input of which is connected to a constant direct current source 72. An output of the multiplier 71 then applies such a direct current signal to an input of a subtracting circuit 73, another input of which is connected to the input 25 of the clamping circuit 27, that, in the signal at an output of the subtracting circuit 73, which is connected to the output 29 of the clamping circuit 27, a d.c. level lies between two data levels which equals a threshold level of the threshold circuit 31.

The clamping circuit 27 therefore causes a reduced adaptation time of the filter. Furthermore, it does not only compensate for a possible level in the input signal of the filter but also for any unwanted direct current component or a possible asymmetry in the threshold circuit 31 which were, for example, caused by direct current couplings in the filter. This makes the filter circuit very suitable for implementation as integrated circuit.

It will be clear that the clamping circuit 27 can be omitted when no direct current component in the corrected signal or asymmetry in the threshold circuit are expected.

Should the filter be suitable for processing a multilevel data signal instead of processing a by-level signal for which the above-mentioned circuit of the filter is intended, the reference signal generation and, consequently, the threshold circuit and the additional control circuit must be adapted thereto.

Instead of a reference signal generated by means of a threshold circuit it is, alternatively, possible to use a reference signal which was generated in a different manner. The automatic gain control can then be used in an analogous manner.

In this example the error signal for the amplitude control circuits is processed in accordance with the method of minimizing the mean square. It will be obvious that this can also be done in a different, suitable manner.

If so desired it is, for example, alternatively possible to use a signal at the output 23 of the adding circuit 21, at the output 32 of the threshold circuit 31 or at the output 34 of the automatic gain control circuit 33 as the output signal of the filter. If the output signal of the filter is obtained from the output 29 of the clamping circuit 27 the amplitude thereof can be kept constant by a control circuit which also uses the output signal of the integrator 65 as its control signal, but which controls into a sense opposite to the sense of the multiplying circuit 63, which may be effected by means of a dividing circuit. It is further possible to apply the output signal of the last-mentioned control circuit to the input 39 of the difference-determining circuit 37 when the multiplying circuit 63 is provided at the output 41 of the difference-determining circuit 37 instead of at the input 35 thereof. In that case, if so desired, the output signal can alternatively be derived from other points in the circuit.

The above-described construction of the amplifying control circuit 33 has the advantage that it is insensitive to noise and yet controls in a rapid manner. Other constructions, for example using peak detection to obtain the control signal, are possible.

A filter according to the invention is suitable for processing synchronous and asynchronous data signals and analog pulse-modulated signals such as, for example, pulse width, pulse duration and pulse position modulated signals. The filter is, for example, also very suitable for asynchronous processing in repeaters, as a circuit for recovering a clock signal is not necessary.

In a filter according to the invention the taps of the delay circuit 3 can be used as inputs thereof if so desired.

The tap of the delay circuit 3 in which no control is effected can alternatively be located in a different location then in the centre, as in the embodiment, and may, if so desired, alternatively be provided with some degree of control.

Figure 2:
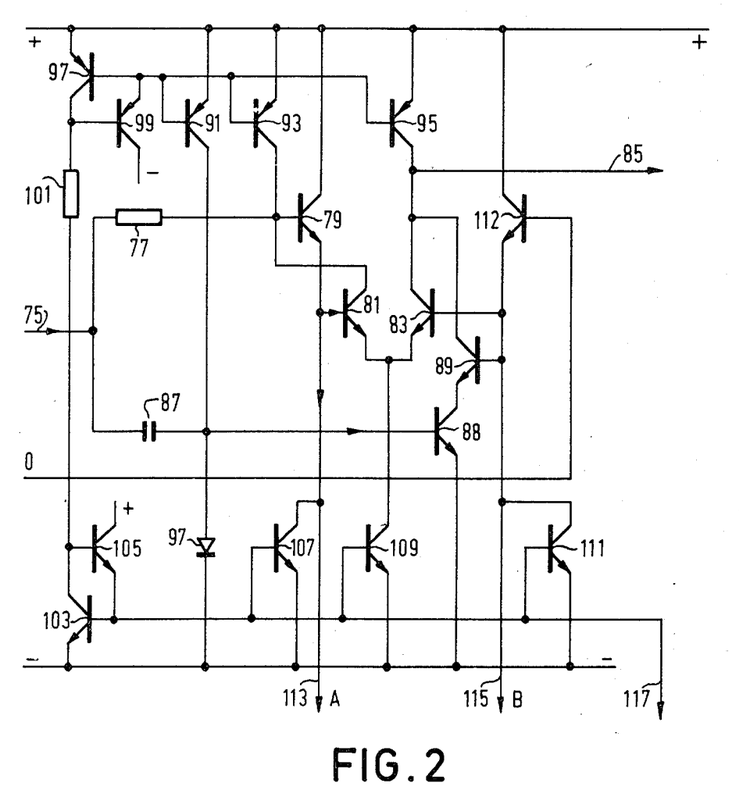
FIG. 2 illustrates by means of a circuit diagram a possible construction of a delay element of a delay circuit for an adaptive filter shown in FIG. 1.

An advantageous construction of the delay circuit 3 which is very suitable for implementation as integrated circuit is described in the Netherlands Patent Application 7709663, corresponding to U.S. application Ser. No. 859,643, filed Dec. 12, 1977, and now U.S. Pat. No. 4,210,882 in which the different delay elements are constructed as Laguerre sections: FIG. 2 describes one section of this delay circuit. It is, of course, alternatively possible to use other types of delay circuits.

The multiplying circuits used need not be linear provided the amplitude of the output signal increases or decreases monotonously versus the amplitude of each of their input signals.

In FIG. 2 a signal applied to an input 75 is applied, via a resistor 77, to a Darlington emitter-follower pair 79, 81 which is coupled by means of their emitters to a transistor 83, the collector of which is connected to an output 85 from which an input signal for the following section is obtained.

The input 75 is further connected to a transistor 88 via a capacitor 87, the collector of this transistor 88 controlling the emitter of a transistor 89. The collector of the transistor 89 is connected to the collector of the transistor 83.

Three transistors 91, 93, 95 form direct current sources for the base-emitter junction, which is bridged by a diode 97, of the transistor 88, for the collector of the transistor 81, which is connected to the base of the transistor 79 and for the collectors of the transistors 83 and 89, respectively. To that end, the bases of the transistors 91, 93 and 95 are connected to the emitter, which is connected to the base of a transistor 97, of a transistor 99, the base of which, which is connected to the collector of the transistor 97, is supplied with a direct current via a resistor 101. This direct current comes from the base, which is connected to the collector of a transistor 103, of a transistor 105, the emitter of which is connected to the base of the transistor 103 and also to the bases of three transistors 107, 109 and 111, which serve as a direct current source for, in this order, the emitter, which is connected to the base of the transistor 81, of the transistor 79, the interconnected emitters of the transistors 81, 85 and the emitter, which is connected to the bases of the transistors 83 and 89, of a transistor 112, the base of which is connected to zero potential.

A signal A which is applied to an output 113 which constitutes a tap of the delay circuit, is obtained from the emitter of the transistor 79. The signal path from the input 75 to this output 113 has a low-pass characteristic the cut-off frequency of which is chosen near the highest frequency of the frequency band of the signal to be passed through the delay circuit. An output 115 has a reference potential B obtained from the emitter of the transistor 111.

An output 117, which caters for direct currents in other portions of the filter is connected to the emitter of the transistor 105.

The circuit has a circuit delaying transfer between the input 75 and the output 85. The product of the values of the resistor 77 and the capacitor 87 determines the time delay.

Figure 3:
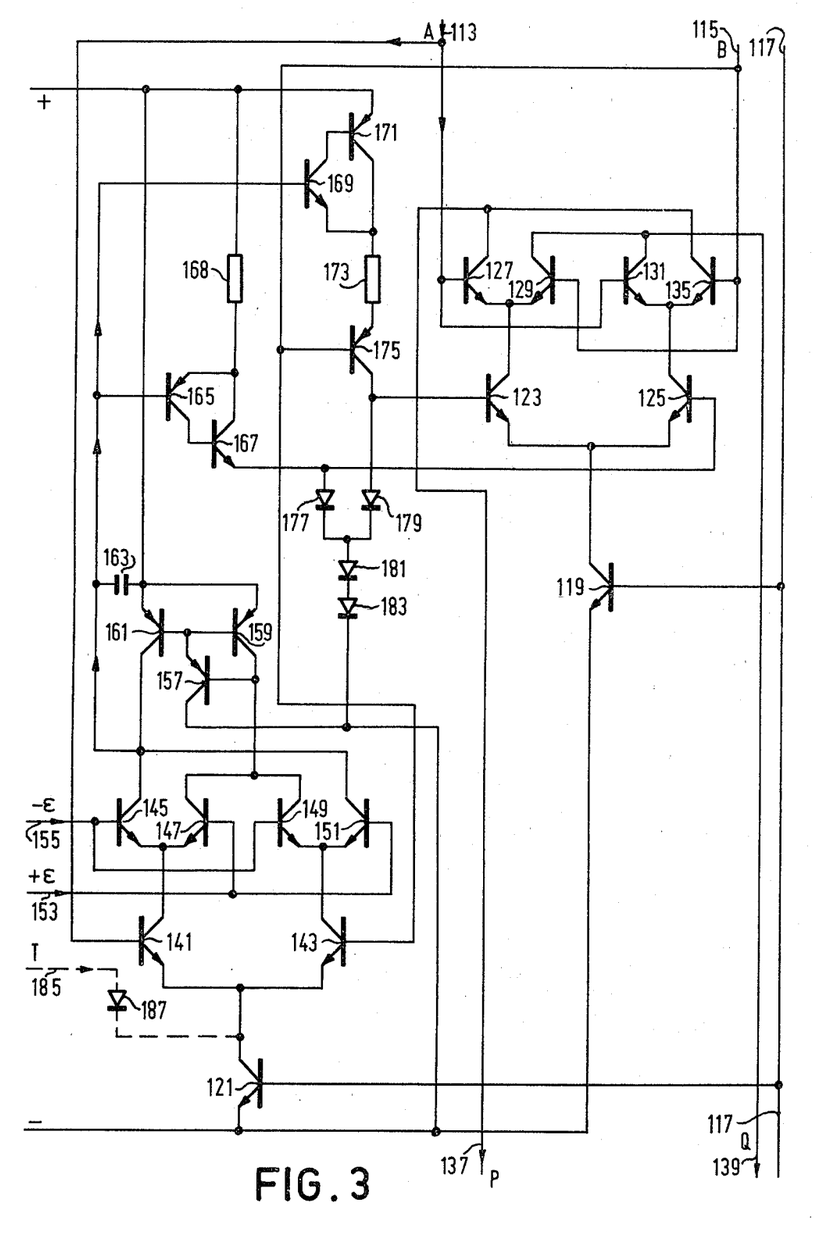
FIG. 3 shows a possible construction of an amplitude control circuit for an adaptive filter shown in FIG. 1.

The terminals 113, 115 and 117 are also terminals of the amplitude control circuit shown schematically in FIG. 3.

In this FIG. 3 the terminal 117 is connected to the bases of 2 current source transistors 119, 121, which each supply the direct current for a multiplying circuit.

A first multiplying circuit is formed by six transistors 123, 125, 127, 129, 131 and 135. The transistors 123, 125 and 127, 129 and 131, 135, respectively, are coupled together by means of their emitters. A control signal is applied in anti-phase to the bases of the transistors 123 and 125. Later in this description it will be described how this control signal is obtained.

The bases of the transistors 127 and 131 are connected to the terminal 113 and are supplied with the signal A from a tap of the delay circuit. The bases of the transistors 129 and 135 are connected to the terminal 115 and are supplied with the reference potential B. The collectors of the transistors 127 and 135 are connected to an output 137 and the collectors of the transistors 129 and 131 are connected to an output 139. The outputs 137 and 139 carry in anti-phase the signals P and Q, respectively, whose amplitudes are controlled by the first multiplying circuit.

The second multiplying circuit is formed by six transistors 141, 143, 145, 147, 149 and 151. The transistors 141, 143 and 145, 147, and 149, 151, respectively, are coupled together by means of their emitters. The signal A originating from the terminal 113 is applied to the base of the transistor 141. The base of the transistor 143 is connected to the reference potential B of the terminal 115. The bases of the transistors 147 and 151 are connected to an input 153 to which the error signal $+\epsilon$ is applied and the bases of the transistors 145 and 149 are connected to an input 155 to which the error signal $-\epsilon$ is applied. The collectors of the transistors 147 and 149 are interconnected and are connected via a current mirror circuit, comprising three transistors 157, 159 and 161, to the interconnected collectors of the transistors 145 and 151, which supply a current to a capacitor 163 which functions as an integrator, this current being a measure of the product of the error signal and the signal A coming from the relevant tap of the delay circuit.

In response thereto a control signal is produced across the capacitor 163, which control signal is applied to the base of the transistor 125 via a complementary pair of transistors 165, 167 which are arranged as an artificial transistor, this pair of transistors having an emitter resistor 168, the control signal also being applied in anti-phase to the base of the transistor 123 via a pair of complementary transistors 169, 171, which are arranged as an artificial transistor, a resistor 173 and a transistor 175. A circuit comprising a number of diodes 177, 179, 181 and 183 at the bases of the transistors 123, 125 converts the currents supplied by the pairs of transistors 165, 167 and 169, 171 into voltages of a suitable level.

The artificial transistors 165, 167 and 169, 171 are complementary and their base currents are equal and opposite when the voltage at the capacitor 163 is at a certain value, which is determined by the resistors 168 and 173, which value adjusts itself if no control current is supplied by the multiplier 145, 147, 149, 151, as is the case at the beginning of the control. The current gains of the artificial transistors 165, 167 and 169, 171 are equal so that at the beginning of a control action the voltages at the bases of the transistors 123 and 125 have the same value and the gain of the first multiplying circuit 123, 125, 127, 129, 131, 135 is zero.

By temporarily cutting off the transistors 141, 143 the second multiplying circuit 141, 143, 145, 147, 149, 151 can be made inactive, if so desired, by means of a gating signal T to be applied to an input 185, this gating signal being applied to the emitters of the transistors 141, 143 via a diode 187. This does not affect the control voltage at the capacitor 163 so that an amplitude setting of the first multiplier resulting from the control, is retained for some time.

Figure 4:
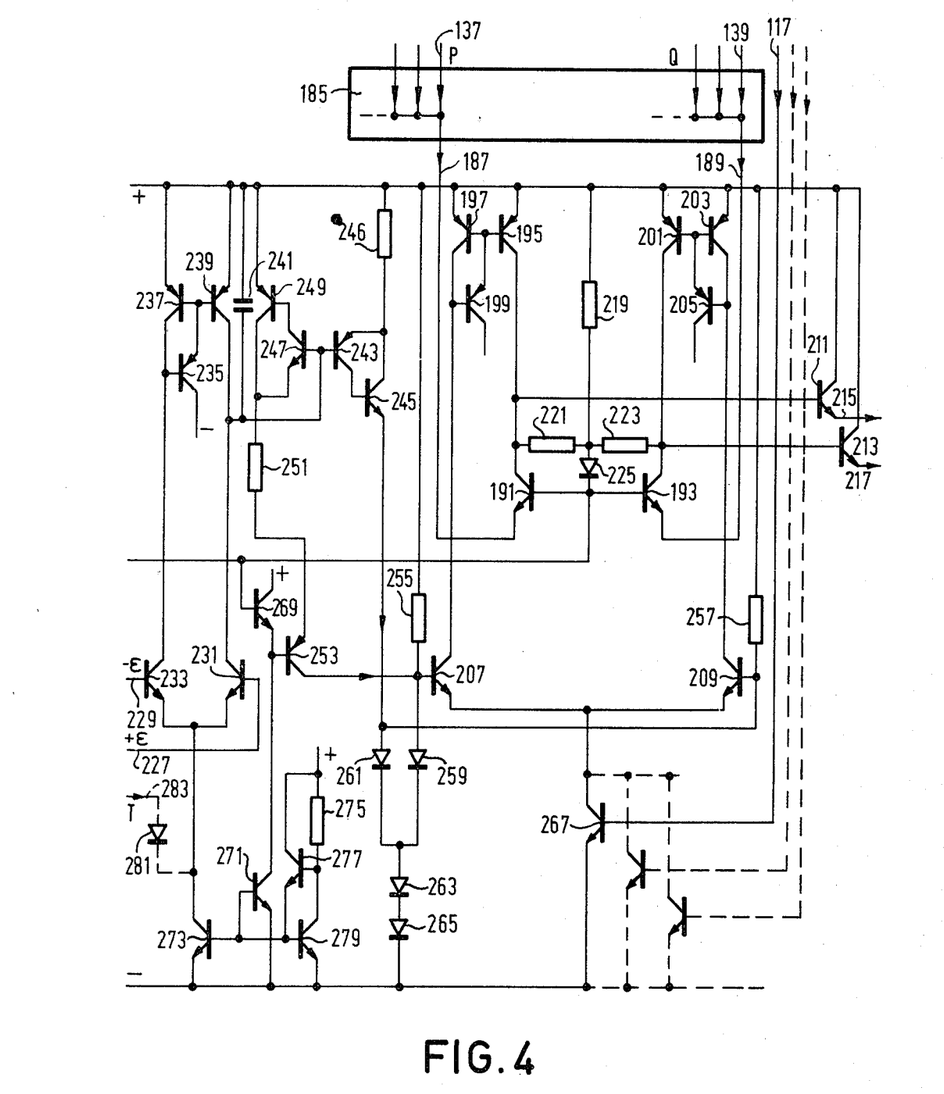
FIG. 4 shows a construction of a clamping circuit in accordance with a further embodiment of the invention for an adaptive filter shown in FIG. 1

In FIG. 4 the signals P and Q coming from the terminals 137 and 139 of the amplitude control circuits are respectively added by an adding circuit 185 and applied to inputs 187 and 189 of a subtracting circuit comprising eight transistors 191, 193, 195, 197, 199, 201, 203 and 205. The other inputs of the subtracting circuit are the collectors of an emitter-coupled pair of transistors 207, 209. The outputs of the subtracting circuit, which are formed by the interconnected collectors of the transistors 191, 195 and 193, 201, respectively, apply clamped output signals in anti-phase to two outputs 215, 217, via two emitter followers 211, 213. A circuit having three resistors 219, 221, 223 and a diode 225 connected to the zero potential, to which also the bases of the transistors 191, 193 are connected, constitutes the output circuit of the subtracting circuit.

Clamping is effected in response to the fact that in the subtracting circuit the direct current component of the signal at the inputs 187, 189 is corrected by the direct currents which are applied via the emitter-coupled pair of transistors 207, 209 to the transistors 199, 197, 195 and 205, 203, 201, respectively, which are arranged to form current mirror circuits.

These direct currents are derived from the error signals $+\epsilon$ and $-\epsilon$ applied in anti-phase to two inputs 227, 229, which error signal controls the bases of an emitter-coupled pair of transistors 231, 233. The collector of the transistor 233 is connected to the collector of the transistor 231 via a current mirror circuit having three transistors 235, 237, 239, so that a difference current, which is a measure of the average difference in voltage at the inputs 227, 229, is applied in this collector circuit to a capacitor 241, which functions as an integrator. In response to this difference current there is produced across the capacitor 241 a control voltage which controls the base of the transistor 209 via a pair of complementary transistors 243, 245, arranged as an artificial transistor and having an emitter resistor 246, and which so controls the base of the transistor 207 via a pair of complementary transistors 247, 249, arranged as an artifical transistor and having a resistor 251, that variations occur in anti-phase at the bases of the transistors 207, 209.

Connected to the bases of the transistors 207, 209 is a further diode circuit 259, 261, 263, 265 which is fed by two resistors 255, 257, whereby the currents supplied by the artificial transistors 243, 245 and 247, 249 are converted into voltages of a suitable level for controlling the bases of the pair of transistors 207, 209. The resistors 255 and 257 have for their function to adapt the control range of the clamping circuit.

The pair of transistors 207, 209 obtains its direct current from a current source transistor 267 the base of which is connected to the terminal 117. There is a current source transistor, as shown by means of a dotted line in FIG. 4, for each Laguerre section as shown schematically in FIG. 2. They compensate for the direct currents which are applied to the inputs 187 and 189 via the signals P and Q.

The base of the transistor 253 is connected to zero potential via an emitter follower 269. The emitter current for the emitter follower 269 is supplied by a current source transistor 271.

The direct current for the pair of transistors 231, 233 is supplied by a current source transistor 273. The bases of the current source transistors 271 and 273 are controlled by a resistor 275 and two transistors 277, 279.

Generation of the control voltage can be temporarily made inactive by cutting off the transistors 231, 233 by means of a gating signal T, applied to the emitters thereof via a diode 281, the gating signal coming from an input 283. The voltage across the capacitor 241 is then not influenced.

Figure 5:
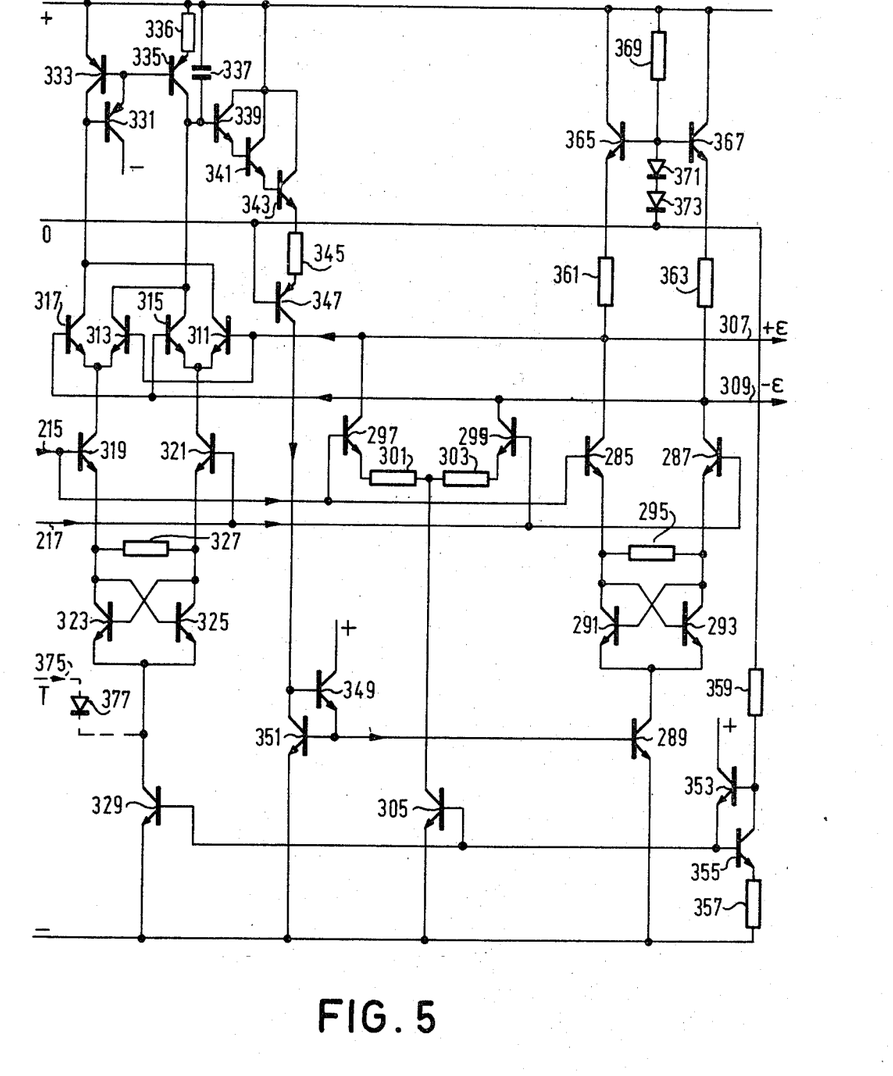
FIG. 5 shows a possible construction of a threshold circuit and an additional control circuit for an adaptive filter shown in FIG. 1.

The outputs 215 and 217 of the clamping circuit of FIG. 4 constitute outputs of the filter circuit and are also inputs of the circuit of FIG. 5.

In FIG. 5 the clamped signal at the inputs 215, 217 is applied in anti-phase to the bases of two transistors 285, 287, which form the further control circuit in combination with a transistor included in the emitter circuits of these transistors, the control signal being applied to the base of the transistor 289. The manner of obtaining this control signal will be described hereinafter. A flip-flop circuit comprising two transistors 291, 293 and a resistor 295 is arranged between the collector of the transistor 289 and the emitters of the transistors 285, 287, causing the further control circuit to operate also as a threshold circuit for the signal at the bases of the transistors 285, 287, so that a two-level signal occurs at the collectors of the transistors, the amplitude of this signal being determined by the control voltage at the base of the transistor 289. When the base of the transistor 285 is positive with respect to that of the transistor 287 the transistor 291 is cutoff and the transistor 293 conducts, so that the current of the current source-transistor 289 flows via the transistor 287, and when the base of the transistor 285 is negative with respect to the base of the transistor 287 this current flows via the transistor 285.

The signals at the inputs 215, 217 are also applied to the bases of two transistors 297, 299 the emitters of which are connected to the collector of a direct current transistor 305 via resistors 301, 303, the collectors being connected to the collectors of the transistors 285 and 287, respectively. As a result thereof the collector circuit of these four transistors 285, 287, 297, 299 forms a difference-determining circuit wherein the output signal of the filter, applied via the transistors 297, 299, and a reference signal supplied by the transistors 285, 287 and having an amplitude which is controlled by a control signal at the base of the transistor 289 are subtracted from one another so that the error signal is supplied in antiphase $+\epsilon$ and $-\epsilon$ at two outputs 307, 309.

This error signal is further applied to the bases of two transistors 311, 313 and 315, 317, respectively. The emitters of the transistors 313 and 317 are connected to the collector of a transistor 319 and the emitters of the transistors 311 and 315 are connected to the collector of a transistor 321 the bases of which are controlled by the signal at the inputs 215, 217 and the emitters of which are connected to the collector of a direct current source transistor 329 via a flip-flop circuit which comprises two transistors 323, 325 and a resistor 327 and which serves as threshold circuit. The interconnected collectors of the transistors 311 and 317 are connected to the interconnected collectors of the transistors 313 and 315 via a current mirror circuit comprising three transistors 331, 333 and 335 and a resistor 336, so that the collectors of the transistors 313 and 315 apply a difference current, which produces a voltage across that capacitor, this voltage being a measure of the value of the error signal multiplied by the sign of the output signal of the filter, to a capacitor 337 which serves as an integrator.

Via three emitter followers 339, 341, 343 and a resistor 345 the voltage at the capacitor 337 is applied to the emitter of a transistor 347, the base of which is connected to zero potential and whose collector applies a control signal to two transistors 349, 351, which form a current mirror circuit together with the transistor 289.

The transistors 305 and 329 form in combination with two transistors 353, 355 and a resistor 357 a current mirror circuit, which is controlled by a resistor 359 from the zero potential.

The direct currents to the collectors of the transistors 285, 287, 297 and 299 are applied via resistors 361, 363 and emitter followers 365, 367, the bases of these emitter followers having been connected to the zero potential at a suitable level via a resistance-diode network 369, 371, 373. The resistors 361 and 363 are low-value resistors and compensate for any inequalities in the transistors 365, 367.

The transistors 319 and 321 can be temporarily cutoff by a gating signal T, which can be applied to an input 375 and which can take over the collector current of the transistor 329 via a diode 377. This does not affect the voltage at the capacitor 337.

For clarity, two threshold circuits 291, 293, 295, and 323, 325, 327 are shown in the construction of FIG. 5 instead of the sole threshold circuit denoted in FIG. 1 by reference numeral 31.

It is possible to derive, for example from a circuit as shown in FIG. 3, a non-controlled circuit 22 of FIG. 1 by arranging in parallel with the emitter-collector path of the transistor 125, the emitter-collector path of a transistor, the base of which is connected to such a voltage that the transistors 123 and 125 are non-conducting.

What is claimed is:

1. An automatic gain control circuit for an adaptive filter, said filter including a delay circuit having a plurality of taps thereto, a plurality of amplitude control circuits coupled respectively to said plurality of taps, correlation circuits for respectively providing control signals for said amplitude control circuits, means for combining the outputs from said amplitude control circuits for forming a corrected output signal of said filter, and a difference determining circuit having an input coupled to the corrected signal output of the filter and an output for providing an error signal which, in turn, is applied to said correlation circuits, characterized in that said automatic gain control circuit is coupled to another input of said difference determining circuit and to the corrected signal output of the filter for deriving a reference signal from the corrected output signal of the filter, said reference signal having a waveform which substantially corresponds to the desired waveform of the corrected output signal, said automatic gain control circuit comprising a further control circuit having a first input and an output coupled respectively to the input and the output of the automatic gain control circuit, an integrator coupled to a second input of said further control circuit for providing a control signal therefor, and a multiplying circuit having inputs coupled respectively to the input of said automatic gain control circuit and the output of said difference determining circuit and an output coupled to said integrator.

2. An automatic gain control circuit as claimed in claim 1, characterized in that the further control circuit is a multiplying circuit.

3. An automatic gain control circuit as claimed in claim 1 or 2, characterized in that the input signal thereto is first applied to a threshold circuit.

* * * * *